United States Patent
Janac et al.

(10) Patent No.: US 12,289,384 B2
(45) Date of Patent: Apr. 29, 2025

(54) SYSTEM AND METHOD FOR SYNTHESIS OF CONNECTIVITY TO AN INTERCONNECT IN A MULTI-PROTOCOL SYSTEM-ON-CHIP (SoC)

(71) Applicant: ARTERIS, INC., Campbell, CA (US)

(72) Inventors: K. Charles Janac, Campbell, CA (US); Vincent Thibaut, Jacou (FR); Benoit de Lescure, Campbell, CA (US)

(73) Assignee: ARTERIS, INC., Campbell, CA (US)

( * ) Notice: Subject to any disclaimer, the term of this patent is extended or adjusted under 35 U.S.C. 154(b) by 601 days.

(21) Appl. No.: 17/665,578

(22) Filed: Feb. 6, 2022

(65) Prior Publication Data
US 2022/0263925 A1  Aug. 18, 2022

Related U.S. Application Data

(60) Provisional application No. 63/149,184, filed on Feb. 12, 2021.

(51) Int. Cl.
  *G06F 15/78*  (2006.01)
  *H04L 69/08*  (2022.01)
  *H04L 69/18*  (2022.01)

(52) U.S. Cl.
  CPC .......... *H04L 69/08* (2013.01); *G06F 15/7825* (2013.01); *H04L 69/18* (2013.01)

(58) Field of Classification Search
  CPC .... G06F 18/2178; G06F 18/217; G06F 18/21; G06F 18/25; G06F 17/18; G06F 16/2477; G06F 2218/00; G06F 18/20; G06F 2211/005; G06F 16/2379; G06F 16/24; G06F 16/245; G06F 30/30; G06F 2115/08; G06F 30/33; G06F 12/128; G06F 13/28;
(Continued)

(56) References Cited

U.S. PATENT DOCUMENTS

| | | |
|---|---|---|
| 5,485,396 A | 1/1996 | Brasen et al. |
| 5,541,849 A | 7/1996 | Rostoker et al. |

(Continued)

FOREIGN PATENT DOCUMENTS

| | | |
|---|---|---|
| CN | 105187313 B | 5/2018 |
| CN | 109587081 A | 4/2019 |

(Continued)

OTHER PUBLICATIONS

Anonymous: "Network on a chip—Wikipedia", Jun. 15, 2021, https://en.wikipedia.org/w/index.php?title-Network_on_a_chip &oldid-1028654828.
(Continued)

*Primary Examiner* — Binh C Tat
(74) *Attorney, Agent, or Firm* — Jubin Dana; Dana Legal Services

(57) ABSTRACT

In accordance with the various aspects and embodiment of the invention, a system and method are disclosed that automate the process of generating protocol converters using machine-readable descriptions of the external hardware components interfaces and the associated protocol. One advantage of the invention is lowered mistakes in generating the protocol converters. Another advantage is increased productivity when designing the interconnect, such as a network-on-chip (NoC) interconnect used in a system-on-chip (SoC).

7 Claims, 5 Drawing Sheets

(58) Field of Classification Search
CPC ............ G06F 13/4068; G06F 30/3308; G06F 12/0811; G06F 12/0813; G06F 12/0815; G06F 12/0824; G06F 12/0831; G06F 12/0833; G06F 12/109; G06F 13/161; G06F 13/1668; G06F 15/17368; G06F 15/7807; G06F 2212/1024; G06F 2212/1048; G06F 2212/305; G06F 2212/455; G06F 2212/657; G06F 30/34; G06F 11/2236; G06F 11/3648; G06F 15/7825; G06F 9/5027; G06F 12/122; G06F 13/1694; G06F 15/7871; G06F 16/27; G06F 21/125; G06F 21/76; G06F 2213/0026; G06F 2213/3808; G06F 30/3323; G06F 9/5005; G06F 9/5011; G06F 9/5038; G06F 9/5066; G06F 13/36; G06F 15/17356; G06F 15/7867; G06F 18/213; G06F 2009/4557; G06F 21/602; G06F 21/6227; G06F 21/6254; G06F 2111/20; G06F 2117/02; G06F 2221/2107; G06F 30/15; G06F 30/327; G06F 30/392; G06F 30/394; G06F 8/452; G06F 9/30047; G06F 9/30145; G06F 9/322; G06F 9/3806; G06F 9/383; G06F 9/3834; G06F 9/3842; G06F 9/3844; G06F 9/44505; G06F 9/45558; G06F 9/5077; G06F 9/54; G06F 9/544; G06F 9/545; G06F 9/547; G06F 2111/02; G06F 2115/02; G06F 30/20; G06F 30/31; G06F 30/32; G06F 30/331; G06F 7/584; H04L 1/0009; H04L 69/08; H04L 69/16; H04L 67/125; H04L 69/18; H04L 49/109; H04L 67/1097; H04L 1/0076; H04L 67/12; H04L 41/16
USPC .................................................. 716/100–106
See application file for complete search history.

(56) References Cited

U.S. PATENT DOCUMENTS

| | | | |
|---|---|---|---|
| 5,623,420 A | 4/1997 | Yee et al. | |
| 5,638,288 A | 6/1997 | Deeley | |
| 5,761,078 A | 6/1998 | Fuller et al. | |
| 5,887,670 A | 3/1999 | Tabata et al. | |
| 5,903,886 A | 5/1999 | Heimlich et al. | |
| 5,983,277 A | 11/1999 | Heile et al. | |
| 6,002,857 A | 12/1999 | Ramachandran | |
| 6,134,705 A | 10/2000 | Pedersen et al. | |
| 6,145,117 A | 11/2000 | Eng | |
| 6,249,902 B1 | 6/2001 | Igusa et al. | |
| 6,321,363 B1 | 11/2001 | Huang et al. | |
| 6,360,356 B1 | 3/2002 | Eng | |
| 6,378,121 B2 | 4/2002 | Hiraga | |
| 6,421,321 B1 | 7/2002 | Sakagawa et al. | |
| 6,437,804 B1 | 8/2002 | Ibe et al. | |
| 6,449,761 B1 | 9/2002 | Greidinger et al. | |
| 6,622,225 B1 | 9/2003 | Kessler et al. | |
| 6,883,455 B2 | 4/2005 | Maeda et al. | |
| 6,907,591 B1 | 6/2005 | Teig et al. | |
| 7,096,436 B2 | 8/2006 | Bednar et al. | |
| 7,398,497 B2 | 7/2008 | Sato et al. | |
| 7,587,687 B2 | 9/2009 | Watanabe et al. | |
| 7,788,625 B1 | 8/2010 | Donlin et al. | |
| 8,020,168 B2* | 9/2011 | Hoover | G06F 15/7825 712/15 |
| 8,042,087 B2 | 10/2011 | Murali et al. | |
| 8,302,041 B1 | 10/2012 | Chan et al. | |
| 8,423,715 B2* | 4/2013 | Heil | G06F 12/122 711/119 |
| 8,819,611 B2 | 8/2014 | Philip et al. | |
| 9,184,998 B2 | 11/2015 | Xue | |
| 9,262,359 B1 | 2/2016 | Noice et al. | |
| 9,444,702 B1 | 9/2016 | Raponi et al. | |
| 9,569,574 B1 | 2/2017 | Khan et al. | |
| 9,792,397 B1 | 10/2017 | Nagaraja | |
| 9,825,779 B2 | 11/2017 | Ruymbeke et al. | |
| 9,940,423 B2 | 4/2018 | Lescure | |
| 10,068,047 B1 | 9/2018 | Finn | |
| 10,282,502 B1 | 5/2019 | BShara et al. | |
| 10,348,563 B2 | 7/2019 | Rao et al. | |
| 10,460,062 B2 | 10/2019 | Feld et al. | |
| 10,733,350 B1 | 8/2020 | Prasad et al. | |
| 10,853,545 B1 | 12/2020 | Nardi et al. | |
| 10,922,471 B2 | 2/2021 | Baeckler et al. | |
| 10,990,724 B1 | 4/2021 | Cherif et al. | |
| 11,121,933 B2 | 9/2021 | Cherif et al. | |
| 11,281,827 B1 | 3/2022 | Labib et al. | |
| 11,449,655 B2 | 9/2022 | Cherif et al. | |
| 2003/0093765 A1 | 5/2003 | Lam et al. | |
| 2004/0040007 A1 | 2/2004 | Harn | |
| 2004/0230919 A1 | 11/2004 | Balasubramanian et al. | |
| 2005/0073316 A1 | 4/2005 | Graham | |
| 2005/0268258 A1 | 12/2005 | Decker | |
| 2007/0156378 A1 | 7/2007 | McNamara | |
| 2007/0157131 A1 | 7/2007 | Watanabe et al. | |
| 2007/0174795 A1 | 7/2007 | Lavagno et al. | |
| 2007/0186018 A1 | 8/2007 | Radulescu et al. | |
| 2008/0046854 A1 | 2/2008 | Tang | |
| 2008/0049753 A1 | 2/2008 | Heinze et al. | |
| 2008/0279183 A1 | 11/2008 | Wiley et al. | |
| 2008/0291826 A1 | 11/2008 | Licardie et al. | |
| 2009/0031277 A1 | 1/2009 | Mcelvain et al. | |
| 2009/0313592 A1 | 12/2009 | Murali et al. | |
| 2010/0061352 A1 | 3/2010 | Fasolo et al. | |
| 2010/0162189 A1 | 6/2010 | Lavagno et al. | |
| 2010/0218146 A1 | 8/2010 | Platzker et al. | |
| 2010/0274785 A1 | 10/2010 | Procopiuc et al. | |
| 2011/0170406 A1 | 7/2011 | Krishnaswamy | |
| 2012/0013509 A1 | 1/2012 | Wisherd et al. | |
| 2012/0311512 A1 | 12/2012 | Michel et al. | |
| 2013/0174113 A1 | 7/2013 | Lecler et al. | |
| 2013/0208598 A1 | 8/2013 | Nakaya et al. | |
| 2013/0258847 A1 | 10/2013 | Zhang et al. | |
| 2013/0283226 A1 | 10/2013 | Ho et al. | |
| 2014/0115218 A1 | 4/2014 | Philip et al. | |
| 2014/0126572 A1 | 5/2014 | Hutton et al. | |
| 2014/0153575 A1 | 6/2014 | Munoz | |
| 2014/0156826 A1 | 6/2014 | Chang et al. | |
| 2014/0160939 A1 | 6/2014 | Arad et al. | |
| 2014/0169173 A1 | 6/2014 | Naouri et al. | |
| 2014/0204735 A1 | 7/2014 | Kumar et al. | |
| 2014/0211622 A1 | 7/2014 | Kumar et al. | |
| 2014/0298281 A1 | 10/2014 | Varadarajan et al. | |
| 2014/0321839 A1 | 10/2014 | Armstrong | |
| 2015/0036536 A1 | 2/2015 | Kumar et al. | |
| 2015/0106778 A1 | 4/2015 | Mangano et al. | |
| 2015/0121319 A1 | 4/2015 | Hutton et al. | |
| 2015/0178435 A1 | 6/2015 | Kumar | |
| 2015/0254325 A1 | 9/2015 | Stringham | |
| 2015/0341224 A1 | 11/2015 | Van et al. | |
| 2015/0347641 A1 | 12/2015 | Gristede et al. | |
| 2016/0103943 A1 | 4/2016 | Xia et al. | |
| 2016/0275213 A1 | 9/2016 | Tomita | |
| 2016/0321390 A1 | 11/2016 | Bozman et al. | |
| 2017/0060204 A1 | 3/2017 | Gangwar et al. | |
| 2017/0063734 A1 | 3/2017 | Kumar | |
| 2017/0132350 A1 | 5/2017 | Janac | |
| 2017/0177778 A1 | 6/2017 | Lescure | |
| 2017/0193136 A1 | 7/2017 | Prasad et al. | |
| 2018/0115487 A1 | 4/2018 | Thubert et al. | |
| 2018/0144071 A1 | 5/2018 | Yu et al. | |
| 2018/0227180 A1 | 8/2018 | Rao et al. | |
| 2019/0012909 A1 | 1/2019 | Mintz | |
| 2019/0073440 A1 | 3/2019 | Farbiz et al. | |
| 2019/0179992 A1* | 6/2019 | Giaconi | G06F 30/394 |
| 2019/0205493 A1 | 7/2019 | Garibay et al. | |
| 2019/0246989 A1 | 8/2019 | Genov et al. | |
| 2019/0251227 A1 | 8/2019 | Fink | |
| 2019/0260504 A1 | 8/2019 | Philip et al. | |

(56) References Cited

U.S. PATENT DOCUMENTS

| | | |
|---|---|---|
| 2019/0363789 A1 | 11/2019 | Lee et al. |
| 2020/0092230 A1 | 3/2020 | Schultz et al. |
| 2020/0162335 A1 | 5/2020 | Chen et al. |
| 2020/0234582 A1 | 7/2020 | Mintz |
| 2020/0366607 A1 | 11/2020 | Kommula et al. |
| 2021/0203557 A1 | 7/2021 | Cherif et al. |
| 2021/0226887 A1 | 7/2021 | Mereddy |
| 2021/0320869 A1 | 10/2021 | Bourai et al. |
| 2021/0409284 A1 | 12/2021 | Cherif et al. |
| 2022/0294704 A1 | 9/2022 | Lescure et al. |

FOREIGN PATENT DOCUMENTS

| | | | |
|---|---|---|---|
| CN | 113051215 | A | 6/2021 |
| CN | 113055219 | A | 6/2021 |
| DE | 102015014851 | A1 | 5/2016 |
| EP | 3842987 | A1 | 6/2021 |
| EP | 4024262 | A1 | 7/2022 |
| EP | 4057179 | A1 | 9/2022 |

OTHER PUBLICATIONS

Haytham Elmiligi et al: "Networks-on-chip topology optimization subject to power, delay, and reliability constraints", IEEE International Symposium on Circuits and Systems, May 30, 2010, pp. 2354-2357 DOI: 10.1109/ISCAS.2010.5537194.

Jain R. et al: "Predicting system-level area and delay for pipelined and nonpipelined designs", IEEE Transactions on Computer Aided Design of Integrated Circuits and Systems, vol. 11, No. 8, Jan. 1, 1992, pp. 955-965, DOI: 10.1109/43.149767.

Jingye Xu et al: "Latch Based Interconnect Pipelining For High Speed Integrated Circuits", Proceedings of the International Conference on Electro/Information Technology, May 1, 2006, pp. 295-300 DOI: 10.1109/EIT.2006.252152.

Jun Minje et al: "Exploiting Implementation Diversity and Partial Connection of Routers in Application-Specific Network-on-Chip Topology Synthesis", IEEE Transactions on Computers, IEEE, USA, vol. 63, No. 6, Jun. 1, 2014 (Jun. 1, 2014), pp. 1434-1445, XP011550397, ISSN: 0018-9340, DOI: 10.1109/TC.2012.294.

Saponara S et al: "Design and coverage-driven verification of a novel network-interface IP macrocell for network-on-chip interconnects", Microprocessors and Microsystems, vol. 35, No. 6 , pp. 579-592, XP028255708 ISSN: 0141-9331, DOI: 10.1016/J.MICPRO.2011.06.005.

Saponara Sergio et al: "Configurable network-on-chip router macrocells", Microprocessors and Microsystems, IPC Business Press Ltd. London, GB, vol. 45, Apr. 29, 2016 (Apr. 29, 2016), pp. 141-150 XP029678799, ISSN: 0141-9331, DOI: 10.1016/J.MICPRO.2016.04.008.

Song Z et al: "A NoC-Based High Performance Deadlock Avoidance Routing Algorithm", Computer and Computational Sciences, 2008. IMSCCS '08, International Multisymposiums On, IEEE Piscataway, NJ, USA, Oct. 18, 2008, pp. 140-143, XP031411025, ISBN: 978-0-7695-3430-5.

Anonymous: "Intel Hyperflex Architecture HighPerformance Design Handbook", Oct. 4, 2021 (Oct. 4, 2021), pp. 1-147, XP093063924, Retrieved from the Internet: URL:https://cdrdv2.intel.com/v1/dl/getContent/667078?fileName=sl0_hp_hb-683353-667078.pdf.

Ken Eguro et al: "Simultaneous Retiming and Placement for Pipelined Net lists", Proceedings of the 16th International Symposium on Field-Programmable Custom Computing Machines, Apr. 14, 2008 (Apr. 14, 2008), pp. 139-148, XP031379339.

Chaari Moomen Moomen Chaari@Infineon Com et al: "A model-based and simulation-assisted FMEDA approach for safety-relevant E/E systems", Proceedings of the 34th ACM SIGMOD-SIGACT-SIGAI Symposium on Principles of Database Systems, ACMPUB27, New York, NY, USA, Jun. 7, 2015 (Jun. 7, 2015), pp. 1-6, XP058511366, DOI: 10.1145/2744769.2747908 ISBN: 978-1-4503-3550-8.

Mariani R et al: "Fault-Robust Microcontrollers for Automotive Applications", On-Line Testing Symposium, 2006. IOLTS 2006. 12th IEEE International Como, Italy Jul. 10-12, 2006, Piscataway, NJ, USA, IEEE, Jul. 10, 2006 (Jul. 10, 2006), pp. 213-218, XP010928275, DOI: 10.1109/IOLTS.2006.38 ISBN: 978-0-7695-2620-1.

Dumitriu Vet Al: "Throughput-Oriented Noc Topology Generation and Analysis for High Performance SoCs", IEEE Transactions on Very Large Scale Integration (VLSI) Systems, IEEE Service Center, Piscataway, NJ, USA, vol. 17, No. 10, Oct. 1, 2009 (Oct. 1, 2009), pp. 1433-1446, XP011267808, ISSN: 1063-8210, DOI: 10.1109/TVLSI.2008.2004592.

Fangfa Fu et al: "A Noc performance evaluation platform supporting designs at multiple levels of abstraction", Industrial Electronics and Applications, 2009. ICIEA 2009. 4TH IEEE Conference on, IEEE, Piscataway, NJ, USA, May 25, 2009 (May 25, 2009), pp. 425-429, XP031482069, ISBN: 978-1-4244-2799-4 *abstract* * p. 426-p. 429 *.

Murali et al: "Synthesis of Predictable Networks-on-Chip-Based Interconnect Architectures for Chip Multiprocessors", IEEE Transactions on Very Large Scale Integration (VLSI) Systems, IEEE Service Center, Piscataway, NJ, USA, vol. 15, No. 8, Aug. 1, 2007 (Aug. 1, 2007) , pp. 869-880, XP011187732, ISSN: 1063-8210, DOI: 10.1109/TVLSI.2007.900742.

Picornell Tomas tompic@gap.upv.es et al: "DCFNoC A Delayed Conflict-Free Time Division Multiplexing Network on Chip", Designing Interactive Systems Conference, ACM, 2 Penn Plaza, Suite 701 New York NY10121-0701 USA, Jun. 2, 2019 (Jun. 2, 2019), pp. 1-6, XP058637807, DOI: 10.1145/3316781.3317794 ISBN: 978-1-4503-5850-7.

Francesco Robino: "A model-based design approach for heterogeneous NoC-based MPSoCs on FPGA", Jul. 1, 2014 (Jul. 1, 2014), XP002806918, Retrieved from the Internet: URL: http://www.divaportal.org/smash/get/diva2:718518/FULLTEXT02.pdf [retrieved on Jun. 22, 2022].

James C. Tiernan. 1970. An efficient search algorithm to find the elementary circuits of a graph. Commun. ACM 13, 12 (Dec. 1970), 722-726. https://doi.org/10.1145/362814.362819.

U.S. Appl. No. 17/134,384, filed Dec. 26, 2020, Federico Angiolini.
U.S. Appl. No. 17/665,578, filed Feb. 6, 2022, K. Charles Janac.

"A distributed interleaving scheme for efficient access to wideIO dram memory", Seiculescu Ciprian, Benini Luca, De Micheli Giovanni, CODES+ISSS'12 (Year: 2012).

"Thread-Fair Memory Request Reordering"; Kun Fang, Nick Iliev, Ehsan Noohi, Suyu Zhang, and Zhichun Zhu; Dept. of ECE, Univeristy of Illinois at Chicago; JWAC-3 Jun. 9, 2012.

19th Asia and South Pacific Design Automation Conterence Alberto Ghiribaldi, Herve Tatenguem Fankem, Federico Angiolini, Mikkel Stensgaard, Tobias Bjerregaard, Davide Bertozzi A Vertically Integrated and Interoperable Multi-Vendor Synthesis Flow for Predictable NoC Design in Nanoscale Technologies.

ACM ICCAD '06 Srinivasan Murali, Paolo Meloni, Federico Angiolini, David Atienza, Salvatore Carta, Luca Benini, Giovanni De Micheli, Luigi Raffo Designing Application-Specific Networks on Chips with Floorplan Information p. 8, Figure 8.

Alessandro Pinto et al, "System level design paradigms", ACM Transactions on Design Automation of Electronic Systems, ACM, New York, NY, US, (Jun. 7, 2004), vol. 11, No. 3, doi:10.1145/1142980.1142982, ISSN 1084-4309, pp. 537-563, XP058222500.

Annual IEEE International SoC Conference Proceedings Mohammad reza Kakoee, Federico Angiolin, Srinivasan Murali, Antonio Pullini, Ciprian Seiculescu, and Luca Benini A Floorplan-aware Interactive Tool Flow for NoC Design and Synthesis pp. 1, 2, 4 2009 Belfast, Northern Ireland, UK.

Bo Huang et al, "Application-Specific Network-on-Chip synthesis with topology-aware floorplanning", Integrated Circuits and Systems Design (SBCCI), 2012 25th Symposium On, IEEE, (Aug. 30, 2012), doi:10.1109/SBCCI.2012.6344421, ISBN 978-1-4673-2606-3, pp. 1-6, XP032471227.

David Atienza et al, Network-on-Chip Design and Synthesis Outlook, Science Direct, Integration the VLSI, journal 41 (2008) 340-359.

(56) References Cited

OTHER PUBLICATIONS

Jean-Jacques Lecler et al: Application driven network-on-chip architecture exploration & refinement for a complex SoC, Design Automation for Embedded Systems, vol. 15 No. 2, Apr. 7, 2011, DOI: 10.1007/S10617-011-9075-5.

K. R. Manik et al., "Methodology for Design of Optimum NOC Based on I PG," 2017 Int'l Conference on Algorithms, Methodology, Model and Applications in Emerging Technologies (ICAM-MAET), Chennai, India, IEEE, 6 pages. (Year: 2017).

Luca Benini: "Application specific Noc design", Design, Automation and Test in Europe, 2006, Date '06 : Mar. 6-10, 2006, [Munich, Germany; Proceedings] / [Sponsored By the European Design and Automation Association], IEEE, Piscataway, NJ, USA, Mar. 6, 2006 (Mar. 6, 2006), pp. 491-495, XP058393584, ISBN: 9783981080100.

Partha et al., Design, Synthesis, and Test of Networks on Chips, IEEE (Year: 2005).

Srinivasan K et al, "Linear programming based techniques for synthesis of network-on-chip architectures", Computer Design: VLSI in Computers and Processors, 2004. ICCD 2004. Pr Oceedings. IEEE International Conference on San Jose, CA, USA Oct. 11-13, 2004, Piscataway, NJ, USA, IEEE, (Oct. 11, 2004), doi: 10.1109/ICCD.2004.1347957, ISBN 978-0-7695-2231-9, pp. 422-429, XP010736641.

Srinivasan Murali et al: "Mapping and physical planning of networks-on-chip architectures with quality-of-service guarantees", Proceedings of the 2005 Asia and South Pacific Design Automation Conference, Jan. 18, 2005, DOI: 10.1145/1120725.1120737.

Tobias Bjerregaard et al: "A Router Architecture for Connection-Oriented Service Guarantees in the MANGO Clockless Network-on-Chip", Proceedings of the IEEE Conference and Exhibition on Design, Automation, and Test in Europe, Mar. 7, 2005, DOI: 10.1109/DATE.2005.36.

Wei Zhong et al: "Floorplanning and Topology Synthesis for Application-Specific Network-on-Chips", IEICE Transactions on Fundamentals of Electronics< Communications and Computer Sciences, Jun. 1, 2013, DOI: 10.1587/TRANSFUN.E96.A.1174.

Zhou Rongrong et al: A Network Components Insertion Method for 3D Application-Specific Network-on-Chip, Proceedings of the 11th IEEE International Conference on Asic, Nov. 3, 2015, pp. 1-4, DOI: 10.1109/ASICON.2015.7516952.

* cited by examiner

SYSTEM AND METHOD FOR SYNTHESIS OF CONNECTIVITY TO AN INTERCONNECT IN A MULTI-PROTOCOL SYSTEM-ON-CHIP (SoC)

CROSS REFERENCE TO RELATED APPLICATION

This application claims priority to U.S. Provisional Application Ser. No. 63/149,184 filed on Feb. 12, 2021 and titled PACKET BASED INTERCONNECT IN A SYSTEM-ON-CHIP (SoC) by K. Charles JANAC, et. al, the entire disclosure of which is incorporated herein by reference.

FIELD OF THE INVENTION

The present technology is in the field of computer system design and, more specifically, related to protocol conversion for a network-on-chip interconnect used in a system-on-chip (SoC).

BACKGROUND

Networks-on-chip (NoC) are interconnects that are used to connect IP blocks that exist in a system-on-chip (SoC). The process of creating packet-based interconnects for SoC, which need to communicate with many IP blocks and hardware components, use interfaces with different communication protocols. The protocols used by the IP blocks and hardware components are typically different from the protocol used by the interconnect. The protocol converters are part of the overall design process. The known processes of designing and setting conversion from one protocol to another is an inefficient process.

Thus, there is a challenge of accurately and efficiently connecting an external hardware element or IP block, which uses a particular physical interface (made of a set of pins) and a communication protocol, to the NoC interconnect thereby allowing for exchange of requests and responses with other IP blocks and components of the SoC. The challenge also includes the difference between the IP block communication protocol and conversion to a packet-based NoC interconnect that uses a different communication protocol internally.

When connecting multiple IP blocks, due to distance between IP blocks. limited range of IP block to drive a signal, and signal routing congestion (e.g., not enough physical space to route every signal of each block), it can be advantageous to connect the IP blocks with a NoC. A challenge the system designer faces is to create a protocol converter block to go between the IP block and the protocol used internally in the NoC, and connecting all these components. The challenge is made even more complex when the system designer has to manage the different interfaces implemented by each IP block. A system designer must manually mange each IP blocks protocol, the NoC internal protocol, the pins for the IP block and the NoC, and the connections both between the IP blocks and NoC and the internal NoC connections. This manually management is both time consuming and error prone which increases the cost of a NoC and the risk of an SoC not performing as expected due to a design error.

Therefore, what is needed is a system and method that increases the efficiency and automates the process of generating protocol converters using machine-readable descriptions of the external hardware components interfaces and the associated protocol.

SUMMARY OF THE INVENTION

In accordance with the various aspects and embodiment of the invention, a system and method are disclosed that automate the process of generating protocol converters using machine-readable descriptions of the external hardware components interfaces and the associated protocol. One advantage of the invention is lowered mistakes in generating the protocol converters. Another advantage is increased productivity when designing the interconnect, such as a network-on-chip (NoC) and assembling the system-on-chip (SoC).

BRIEF DESCRIPTION OF THE DRAWINGS

In order to understand the invention more fully, reference is made to the accompanying drawings. The invention is described in accordance with the aspects and embodiments in the following description with reference to the drawings or figures (FIG.), in which like numbers represent the same or similar elements. Understanding that these drawings are not to be considered limitations in the scope of the invention, the presently described aspects and embodiments and the presently understood best mode of the invention are described with additional detail through use of the accompanying drawings.

DETAILED DESCRIPTION

Figure 1:
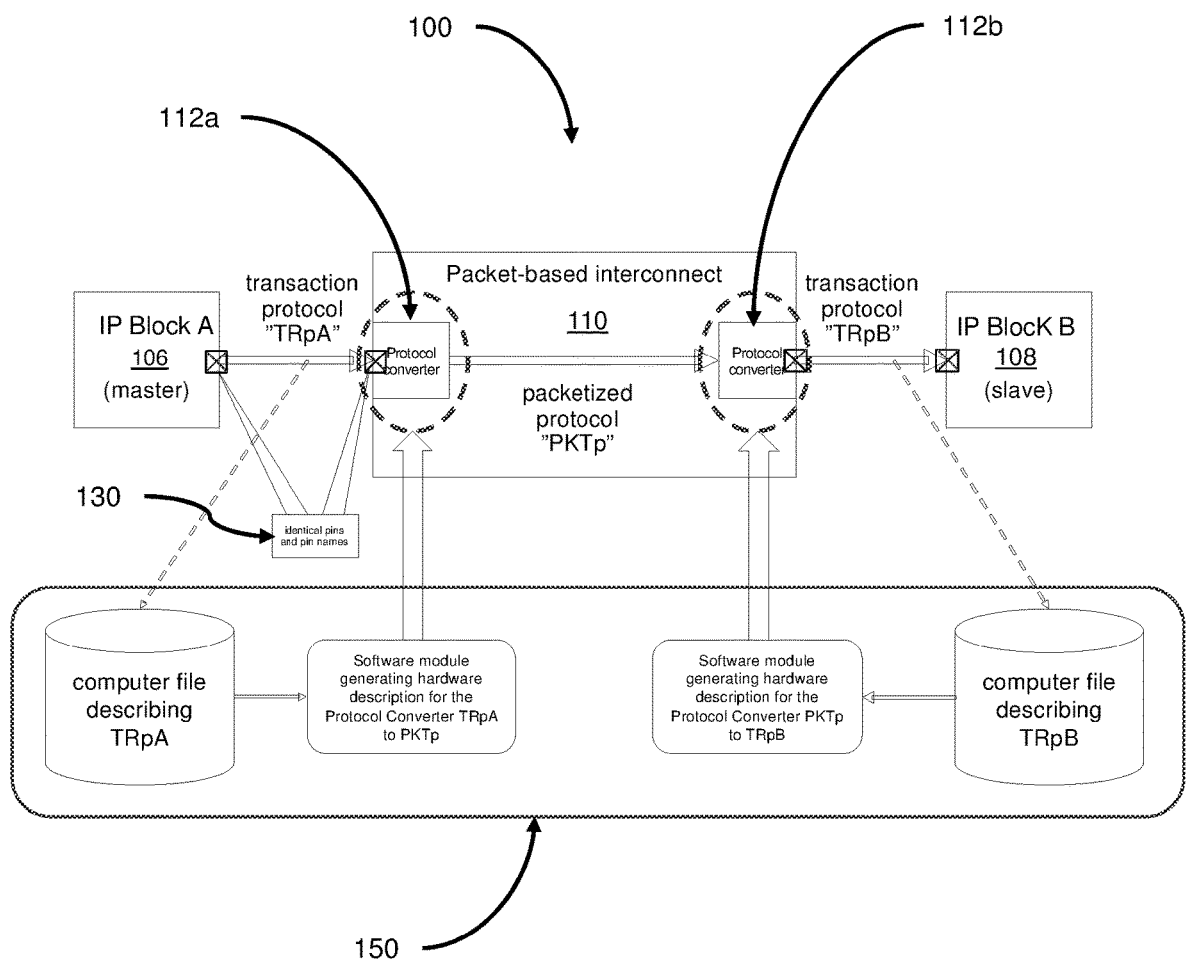
FIG. 1 shows a system in accordance with the various aspects and embodiments of the invention.

The following describes various examples of the present technology that illustrate various aspects and embodiments of the invention. Generally, examples can use the described aspects in any combination. All statements herein reciting principles, aspects, and embodiments as well as specific examples thereof, are intended to encompass both structural and functional equivalents thereof. The examples provided are intended as non-limiting examples. Additionally, it is intended that such equivalents include both currently known equivalents and equivalents developed in the future, i.e., any elements developed that perform the same function, regardless of structure.

It is noted that, as used herein, the singular forms "a," "an" and "the" include plural referents unless the context clearly dictates otherwise. Reference throughout this specification to "one embodiment," "an embodiment," "certain embodiment," "various embodiments," or similar language means that a particular aspect, feature, structure, or characteristic described in connection with the embodiment is included in at least one embodiment of the invention.

Thus, appearances of the phrases "in one embodiment," "in at least one embodiment," "in an embodiment," "in certain embodiments," and similar language throughout this specification may, but do not necessarily, all refer to the same embodiment or similar embodiments. Furthermore, aspects and embodiments of the invention described herein are merely exemplary, and should not be construed as limiting of the scope or spirit of the invention as appreciated by those of ordinary skill in the art. The disclosed invention is effectively made or used in any embodiment that includes any novel aspect described herein. All statements herein reciting principles, aspects, and embodiments of the invention are intended to encompass both structural and functional equivalents thereof. It is intended that such equivalents include both currently known equivalents and equivalents developed in the future. Furthermore, to the extent that the terms "including", "includes", "having", "has", "with", or variants thereof are used in either the detailed description and the claims, such terms are intended to be inclusive in a similar manner to the term "comprising."

The terms "source," "master," and "initiator" refer to hardware intellectual property (IP) modules/blocks or units; these terms are used interchangeably within the scope and embodiments of the invention. As used herein, the terms "sink," "slave," and "target" refer to hardware IP modules or units and the terms are used interchangeably within the scope and embodiments of the invention. As used herein, a transaction may be a request transaction or a response transaction. Examples of request transactions include write request and read request.

Various references are made herein to integrated circuits (ICs) and the designs of ICs. One example of an IC is a multiprocessor system that is implemented in systems-on-chip (SoCs) that communicates through networks-on-chip (NoC), which is an interconnect. The SoCs include instances of initiator intellectual properties (IPs) and target IPs. The IP elements or blocks includes pins that have names and connect to the NoC's pins. The NoC pins also have names. Transactions are sent from an initiator to one or more targets using industry-standard protocols. The initiator, which is connected to the NoC, sends a request transaction to a target or targets, using a protocol. The transaction includes an address that identifies or selects the target or targets. The protocol used by one IP can vary from the protocol used by another IP; both can be different from the protocol used by the NoC or interconnect. The NoC includes network interface units (NIU) that act as protocol converters, which are at the boundary of the NoC and convert (decode) from a protocol (of an external device connected to the pins of the NoC) to the internal protocol of the NoC in accordance with various embodiments and aspects of the invention. The NoC decodes the address at the boundary (where the NIUs are located) and transports the request through the NoC to another NIU located at the boundary of the NoC, which other NIU is in communication with the target (destination). The transaction is converted from the NoC's protocol to the target's protocol at the NIU or the boundary of the NoC. The target receives and handles the transaction. The target then sends a response transaction, which is transported back by the NoC to the initiator. As such, the SoC and NoC include complexity and configurability, especially in situation when the NoC is configurable.

Referring now to FIG. 1, a system 100 is shown with IP block A 106 in communication with IP block B 108 through a Network-on-Chip (NoC) interconnect 110 in accordance with the various aspects and embodiments of the invention. Protocol converters 112 (shows as protocol converter 112a and 112b) are used for the connection of the external hardware element (such as IP block A 106 and IP block B 108) to the interconnect 110. In accordance with some embodiments of the invention, the protocol converter 112 is a hardware component that translate requests and responses presented by IP blocks or the external hardware element, which is using its own protocol, to the protocol of the interconnect 110, which is using a different protocol. In accordance with one aspect and embodiment of the invention, requests and responses, coming to and from, respectively, the interconnect 110 are packet-based and are converted to and from the interconnect 110's protocol. In accordance with some aspect and embodiment of the invention, the protocol converter 112 exposes on the IP block or external hardware component side, the same pins 130 (identical pins and pin names) as the ones used by the external hardware component interface. Thus, the naming convention is consistent, efficient, and avoid mistakes. In accordance with the various aspects of the invention, the naming convention is used in order to determine the connectivity of the IP block pins with the interconnect pins, even though there are different protocols being used.

Figure 2:
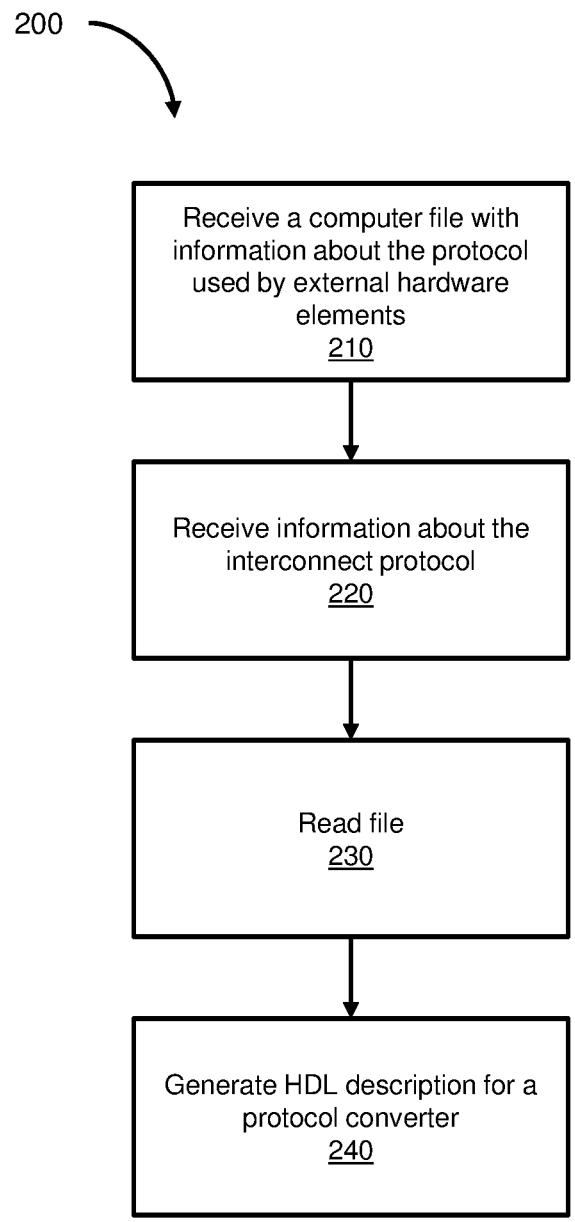
FIG. 2 shows a process in accordance with the various embodiment and aspects of the invention.

Referring now to FIG. 1 and FIG. 2, a process 200 is shown for generating a protocol converter in accordance with various aspects and embodiments of the invention. As shown in block 150, the protocol used by the external hardware element is described in a computer file. The format of the file does not limit the scope of the invention and, hence, is not specified. The format of the file, for non-limiting examples in accordance with one aspect of the invention, may include a format based on XML with a defined semantic to describe interfaces and associated communication protocols. The level of the protocol description does not limit the scope of the invention; it can be as simple as a reference to a well-known protocol such as AMBA-AXI; or as complex as detailing the protocol behavior.

Referring specifically to FIG. 2, at step 210, the process 200 receives the computer file, which includes information about the protocol used by the external hardware elements, such as IP blocks and IP block protocol. The information includes hardware information, such IP block pin names. At step 220, the process receives information about the interconnect and the interconnect protocol. The information may be in a format. In accordance with some aspects of the invention, the information includes interconnect pin names and interconnect packet-based protocol. At step 230, the process reads the computer file, which has the requirements for generating the corresponding protocol converter; the file is processed to determine the way that the file describes protocols. In accordance with the various aspects of the invention, at step 240, the method produces the hardware description of the protocol converter, in the form of a Hardware Description Language (HDL) file, suitable for implementation as actual hardware using standard ASIC implementation flows.

In accordance with the various aspects and embodiments of the invention, the process produces other collaterals to help with the ASIC implementation flow, such as, for instance: synthesis scripts, integration-oriented XML files, gates, and power estimates and so on. In accordance with some aspects and embodiments of the invention, the protocol converter is integrated in a network interface unit (NIU) of the packet-based interconnect. The NIU and enables communication with the external hardware element, which uses a different protocol. In accordance with some aspects and embodiments of the invention, the protocol converter uses the same pins and the same pin names as the ones used by the IP block or the external hardware element. Thus, connection of pins of the external hardware element to the pins of the protocol converter is straightforward because pins with identical names connect to each other.

Based on the process being implement in accordance with the various aspects of the invention, protocol converts are automatically, efficiently, and accurately created for packet-based NoC interconnects. The protocol converters include interfaces that have pins with names that exactly match the pin name of the external hardware elements or IP blocks, to which the pins connect. In accordance with various embodiments and aspects of the invention, a NoC description, which includes the protocol converter description, is generated using a synthesis tool during the design process.

Figure 3:
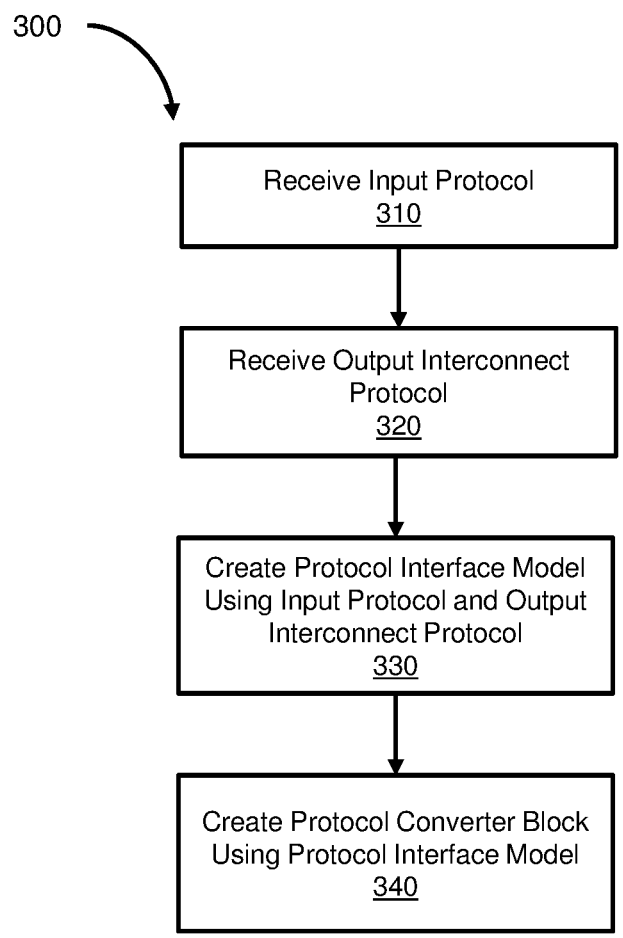
FIG. 3 shows a process for creating a protocol converter block in accordance with various aspects and embodiments of the invention.

Referring now to FIG. 3 a process 300 is shown for creating a protocol converter block in accordance with various aspects and embodiments of the invention. At step 310, an input protocol is received. According to one or more aspects and embodiments of the invention, the input protocol may be read from a computer file. According to one or more aspects and embodiments of the invention, the input protocol may be read from a database, any other computer readable format, and any combination of the preceding. According to one or more aspects and embodiments of the invention, a computer file describes an interface along with the pins and the associated input protocol. According to one or more aspects and embodiments of the invention, the input protocol may be specified as a standard interface type (e.g., Advanced eXtensible Interface (AMBA-AXI)). According to one or more aspects and embodiments of the invention, the input protocol may be specified by a behavioral description of the interface.

At step 320, an output interconnect protocol is received. According to one or more aspects and embodiments of the invention, the output interconnect protocol may be read from a computer file. According to one or more aspects and embodiments of the invention, a computer file describes an interface along with the pins and the associated output interconnect protocol. According to one or more aspects and embodiments of the invention, the output interconnect protocol may be specified as a standard interface type (e.g., Advanced eXtensible Interface (AMBA-AXI)). According to one or more aspects and embodiments of the invention, the output interconnect protocol may be specified by a behavioral description of the interface.

At step 330, a protocol interface module or model is created using the input protocol and the output interconnect protocol. According to one or more aspects and embodiments of the invention, the protocol interface model is read from a computer file.

At step 340, a protocol converter block is created using the protocol interface model. According to one or more aspects and embodiments of the invention, the protocol converter block has an interface to handle bi-directional traffic flow, using input interfaces and output interfaces. The input interface of the protocol converter block implements the input protocol and the output interface implements the output interconnect protocol. According to one or more aspects and embodiments of the invention, the protocol converter converts in a bi-directional manner between input protocol and the output interconnect protocol. According to one or more aspects and embodiments of the invention, the protocol converter block translates requests and responses between the input protocol and the output interconnect protocol. According to one or more aspects and embodiments of the invention, the input protocol is packet-based. According to one or more aspects and embodiments of the invention, the output interconnect protocol is packet-based. According to one or more aspects and embodiments of the invention, creating the protocol converter block may be done locally, remotely (e.g., remote server), and any combination of the preceding.

According to one or more aspects and embodiments of the invention, the protocol converter block is created in a hardware format (e.g., HDL, Verilog, netlist, etc.). According to one or more aspects and embodiments of the invention, the protocol converter block is created in a high-level description (e.g., SystemVerilog, System-C, etc.).

According to one or more aspects and embodiments of the invention, one or more of the input protocols, output interconnect protocol, and protocol interface model may be contained within one or more computer files. According to one or more aspects and embodiments of the invention, one or more of the input protocols, output interconnect protocol, and protocol interface model may be contained within a database. According to one or more aspects and embodiments of the invention, one or more of the input protocols, output interconnect protocol, and protocol interface model may be contained within any computer readable format capable of storing protocols and/or models. According to one or more aspects and embodiments of the invention, one or more of the input protocols, output interconnect protocol, and protocol interface model may be stored locally, remotely, or a combination of locally and remotely.

Figure 4:
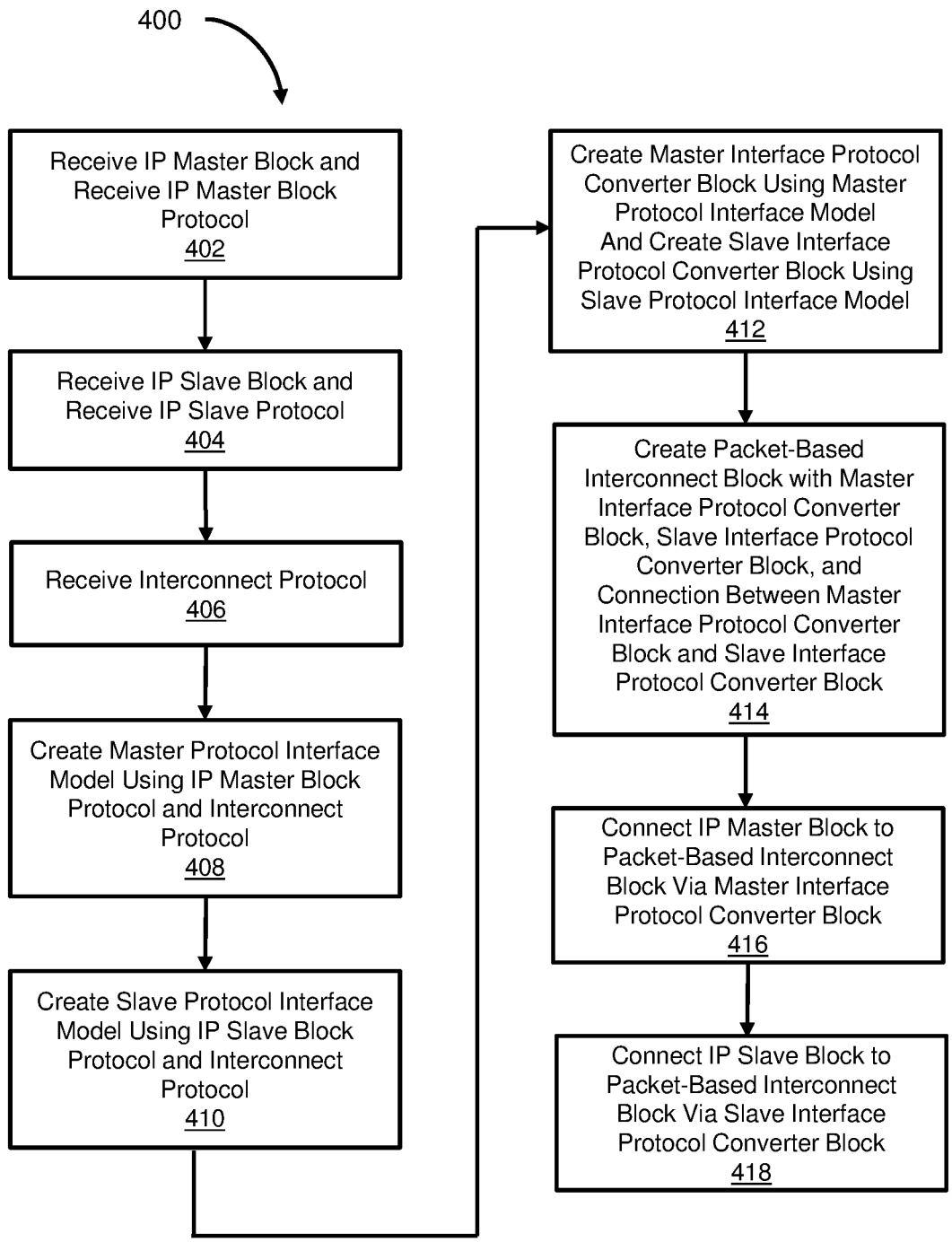
FIG. 4 shows a process for creating a protocol converter block in accordance with various aspects and embodiments of the invention.

Referring now to FIG. 4 a process 400 is shown for creating a protocol converter block in accordance with various aspects and embodiments of the invention. At step 402, IP master block and IP master block protocol is received. According to one or more aspects and embodiments of the invention, the IP master block protocol may be read from a computer file. According to one or more aspects and embodiments of the invention, IP master block protocol may be the same or similar to the input protocol of step 310.

At step 404, IP slave block and IP slave protocol is received. According to one or more aspects and embodiments of the invention, the IP slave block protocol may be read from a computer file. According to one or more aspects and embodiments of the invention, IP master block protocol and IP slave block protocol are read from the same computer file. According to one or more aspects and embodiments of the invention, IP slave block protocol may be the same or similar to the input protocol of step 310.

At step 406, interconnect protocol is received. According to one or more aspects and embodiments of the invention, the interconnect protocol may be read from a computer file. According to one or more aspects and embodiments of the invention, one or more of the IP master block protocol, IP slave protocol is received, and interconnect protocol is read from one or more computer files. According to one or more aspects and embodiments of the invention, interconnect protocol may be the same or similar to the output interconnect protocol of step 320.

At step 408, a master protocol interface model is created using the IP master block protocol and the interconnect protocol. According to one or more aspects and embodiments of the invention, creating master protocol interface model may be the same or similar to creating the protocol interface of step 330. At step 410, a slave protocol interface model using IP slave block protocol and interconnect protocol is created. According to one or more aspects and embodiments of the invention, creating slave protocol interface model may be the same or similar to creating the protocol interface of step 330.

At step 412, a master interface protocol converter block is created using the master protocol interface model and a slave interface protocol converter block is created using the slave protocol interface model. According to one or more aspects and embodiments of the invention, the master interface protocol converter block and/or slave interface protocol converter block is created in a hardware format (e.g., HDL, Verilog, netlist, etc.). According to one or more aspects and embodiments of the invention, the master interface protocol converter block and/or slave interface protocol converter block is created in a high-level description (e.g., System-Verilog, System-C, etc.). According to one or more aspects and embodiments of the invention, creating the master interface protocol converter block is the same or similar as creating the protocol converter block of step 340. According to one or more aspects and embodiments of the invention, creating the slave interface protocol converter block is the same or similar as creating the protocol converter block of step 340. According to one or more aspects and embodiments of the invention, the master interface protocol converter block pins are given the same respective name as the IP master block pins. A potential benefit of having the same pin names between the master interface protocol converter block pins and the IP master blocks pins is to aid in the connection of the master interface protocol convert block and the IP master block. For example, if a human is connecting the blocks, the person would know to connect the same pin names. For another example, automated software can be used to connect the same pin names.

According to one or more aspects and embodiments of the invention, the slave interface protocol converter block pins are given the same respective name as the IP slave block pins. A potential benefit of having the same pin names between the slave interface protocol converter block pins and the IP slave blocks pins is to aid in the connection of the slave interface protocol convert block and the IP slave block. For example, if a human is connecting the blocks, the person would know to connect the same pin names. For another example, automated software can be used to connect the same pin names. According to one or more aspects and embodiments of the invention, a lookup table may be used to map between a protocol and the pin names.

At step 414, a packet-based interconnect block is created that include the master interface protocol converter block, the slave interface protocol converter block, and connection between the master interface protocol converter block and the slave interface protocol converter block.

At step 416, the IP master block is connected to the packet-based interconnect block via master interface protocol converter block. At step 418, the IP slave block is connected to the packet-based interconnect block via slave interface protocol converter block.

According to one or more aspects and embodiments of the invention, packet-based interconnect block enables the IP master block to communicate with the IP slave block. The IP master block communicates with the master interface protocol converter block using the IP master block protocol. The IP slave block communicates with the slave interface protocol converter block using the IP slave block protocol. The IP master block converter converts the IP master block protocol into an interconnect protocol. The packet-based interconnect block routes the interconnect protocol to the IP slave block converter. The IP slave block converter converts the interconnect protocol to the IP slave protocol and then communicates with the IP slave block using the IP slave protocol.

According to one or more aspects and embodiments of the invention, though it is taught that a master and slave communicate via the packet-based interconnect block, any number of IP blocks may communicate using the packet-based interconnect block. For example, a central processor unit (CPU), a memory array, and a hard driver interface controller may communicate between using the packet-based interconnect block.

According to one or more aspects and embodiments of the invention, interfaces to IP blocks includes the packet-based interconnect, any number of connections (e.g., wires), and components (e.g., switches, buffers, queues, etc.).

According to one or more aspects and embodiments of the invention, the IP master block and/or the IP slave block may have a non-packet-based interface (e.g., serial interface, parallel interface, etc.), and the packet-based interconnect black has an internal packet-based interface (e.g., interconnect protocol). For example, IP master block protocol and/or IP slave block protocol may have a non-packet-based interface, and the interconnect protocol is packet based.

Figure 5:
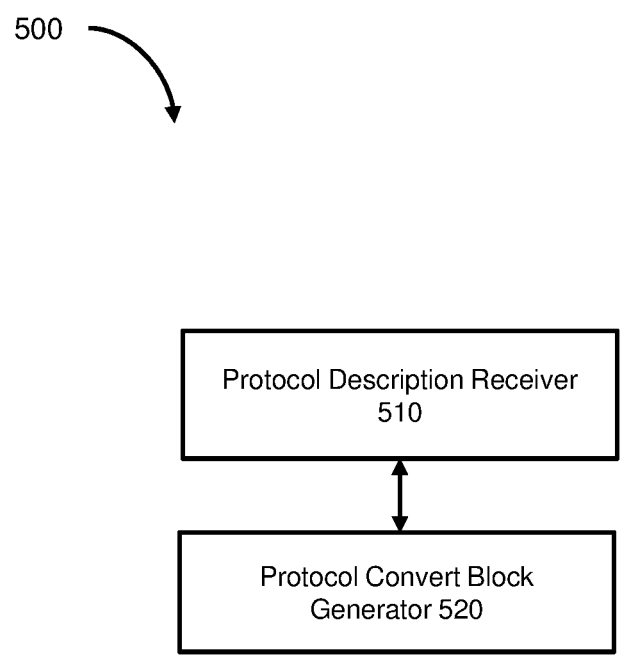
FIG. 5 shows a system for generating and creating a protocol converter block in accordance with various aspects and embodiments of the invention.

Referring now to FIG. 5 an apparatus 500 is shown for creating a protocol converter block in accordance with various aspects and embodiments of the invention. Protocol description receiver 510 receives one or more protocols. According to one or more aspects and embodiments of the invention, the protocols may be stored in one or more computer files. According to one or more aspects and embodiments of the invention, the one or more protocols may include an input protocol and an output protocol for one or more protocol converter blocks. According to one or more aspects and embodiments of the invention, protocol description receiver 510 may perform the same to similar to steps 310 and 320 of FIG. 3.

Protocol converter block generator 520 creates one or more converter blocks with the one or more protocols from receiver 510. According to one or more aspects and embodiments of the invention, protocol converter block generator 520 may perform the same or similar to steps 330 and 340 of FIG. 3. According to one or more aspects and embodiments of the invention, a master protocol interface block is created that converts between an IP master block protocol and an interconnect protocol, and a slave protocol interface block is created that converts between an IP slave block protocol and an interconnect protocol.

Certain methods according to the various aspects of the invention may be performed by instructions that are stored upon a non-transitory computer readable medium, for example a module. The non-transitory computer readable medium stores code including instructions that, if executed by one or more processors, would cause a system or computer to perform steps of the method described herein, including methods performed by a module, such as the modules described herein. The non-transitory computer readable medium includes: a rotating magnetic disk, a rotating optical disk, a flash random access memory (RAM) chip, and other mechanically moving or solid-state storage media.

Any type of computer-readable medium is appropriate for storing code comprising instructions according to various example. Some examples are one or more non-transitory computer readable media arranged to store such instructions for methods described herein. Additionally, modules may be represented by codes stored in non-transitory media or represented by hardware components that performs a specific function. Whatever machine holds non-transitory computer readable media comprising any of the necessary code may implement an example. Some examples may be implemented as: physical devices such as semiconductor chips; hardware description language representations of the logical or functional behavior of such devices; and one or more non-transitory computer readable media arranged to store such hardware description language representations.

Descriptions herein reciting principles, aspects, and embodiments encompass both structural and functional equivalents thereof. Elements described herein as coupled have an effectual relationship realizable by a direct connection or indirectly with one or more other intervening elements.

Certain examples have been described herein and it will be noted that different combinations of different components from different examples may be possible. Salient features are presented to better explain examples; however, it is clear that certain features may be added, modified and/or omitted without modifying the functional aspects of these examples as described.

Various examples are methods that use the behavior of either or a combination of machines. Method examples are complete wherever in the world most constituent steps occur. For example, and in accordance with the various aspects and embodiments of the invention, IP elements or units include: processors (e.g., CPUs or GPUs), random-access memory (RAM—e.g., off-chip dynamic RAM or DRAM), a network interface for wired or wireless connections such as ethernet, Wi-Fi, 3G, 4G long-term evolution (LTE), 5G, and other wireless interface standard radios. The IP block or element may also include various I/O interface devices, as needed for different peripheral devices such as touch screen sensors, geolocation receivers, microphones, speakers, Bluetooth peripherals, and USB devices, such as keyboards and mice, among others. By executing instructions stored in RAM devices processors perform steps of methods as described herein.

Practitioners skilled in the art will recognize many modifications and variations. The modifications and variations include any relevant combination of the disclosed features. Descriptions herein reciting principles, aspects, and embodiments encompass both structural and functional equivalents thereof. Elements described herein as "coupled" or "communicatively coupled" have an effectual relationship realizable by a direct connection or indirect connection, which uses one or more other intervening elements. Embodiments described herein as "communicating" or "in communication with" another device, module, or elements include any form of communication or link and include an effectual relationship. For example, a communication link may be established using a wired connection, wireless protocols, near-field protocols, or RFID.

The scope of the invention, therefore, is not intended to be limited to the exemplary embodiments shown and described herein. Rather, the scope and spirit of present invention is embodied by the appended claims.

What is claimed is:

1. A design tool comprising:
a memory for storing code; and
a processor in communication with the memory, wherein the processor executes the code that causes the design tool to:
  receive information for a network-on-chip (NoC), wherein the information includes interconnect pin names and NoC packet-based protocol;
  receive hardware information for an IP block that is in communication with the NoC, wherein the hardware information includes IP block pin names and IP block protocol;
  generate a description for a protocol converter that handles protocol conversion between the IP block protocol and the NoC packet-based protocol, wherein the description includes NoC interface description that converts to and from the NoC packet-based protocol;
  generate an initiator interface protocol conversion module when the IP block is an initiator IP block that is in communication with the NoC using a first protocol;
  generate a target interface protocol conversion module for a target IP block that is in communication with the initiator IP block using the NoC, the target IP block uses a second protocol;
  connect the initiator IP block using the initiator interface protocol conversion module to the NoC; and
  connect the target IP block using the target interface protocol conversion module to the NoC.

2. The design tool of claim 1, wherein the NoC's pins are communicatively connected to the IP block's pins when a NoC pin name matches a IP block pin name to eliminate error as the protocol converter is automatically generated.

3. A method comprising:
  receiving NoC information for an NoC, the NoC information including NoC pin names and NoC protocol;
  receiving hardware information for an IP block that is in communication with the NoC, the hardware information including IP block pin names and IP block protocol;
  generating protocol converter's description based on the IP block protocol and the NoC protocol, wherein the description includes a NOC interface's description, which handles conversion of transactions from the IP block protocol to the NoC protocol for an IP block pin connected to a NoC pin with a matching name;
  generate a protocol conversion module for the IP block, which is an initiator IP block that is in communication with the NoC using the IP block protocol;
  generate a target interface protocol conversion module for a target IP block that is in communication with the IP block using the NoC, the target IP block uses a second protocol;
  connect the IP block using the protocol conversion module to the NoC; and
  connect the target IP block using the target interface protocol conversion module to the NoC.

4. The method of claim 3, further comprising generating an initiator interface protocol convert module when the IP block is an initiator IP block that is in communication with the NoC.

5. The method of claim 3, wherein the NoC uses a packet-based protocol and is different from the IP block protocol and the second protocol.

6. The method of claim 3 further comprising connecting a pin of the IP block to a pin of the NoC when a name of the pin of the IP block matches to a name of the pin of the NoC.

7. The method of claim 3 further comprising connecting a pin of the target IP block to a pin of the NoC when a name of the pin of the target IP block matches to a pin name of of the NoC.

* * * * *